United States Patent
Fritsch et al.

(10) Patent No.: US 9,684,327 B2
(45) Date of Patent: Jun. 20, 2017

(54) PROTECTING PASSIVE HF GENERATOR COMPONENTS

(71) Applicant: TRUMPF Huettinger GmbH + Co. KG, Freiburg (DE)

(72) Inventors: Christian Fritsch, Waldkirch (DE); Ekkehard Mann, Gundelfingen (DE); Gerhard Seifert, Simonswald (DE)

(73) Assignee: TRUMPF Huettinger GmbH + Co. KG, Freiburg (DE)

( * ) Notice: Subject to any disclaimer, the term of this patent is extended or adjusted under 35 U.S.C. 154(b) by 710 days.

(21) Appl. No.: 14/163,353

(22) Filed: Jan. 24, 2014

(65) Prior Publication Data

US 2014/0159580 A1 Jun. 12, 2014

Related U.S. Application Data

(63) Continuation of application No. PCT/DE2012/100223, filed on Jul. 25, 2012.

(30) Foreign Application Priority Data

Jul. 28, 2011 (DE) .................. 10 2011 080 035

(51) Int. Cl.
*H05H 1/46* (2006.01)
*G05F 3/00* (2006.01)
*H01J 37/32* (2006.01)

(52) U.S. Cl.
CPC .......... *G05F 3/00* (2013.01); *H01J 37/32174* (2013.01); *H05H 1/46* (2013.01)

(58) Field of Classification Search
None
See application file for complete search history.

(56) References Cited

U.S. PATENT DOCUMENTS

| 5,643,364 | A   |   | 7/1997  | Zhao et al.                        |
|-----------|-----|---|---------|------------------------------------|
| 6,313,584 | B1  | * | 11/2001 | Johnson ............ H01J 37/32082 |
|           |     |   |         | 315/111.21                         |
| 7,042,311 | B1  |   | 5/2006  | Hilliker et al.                    |
| 7,244,344 | B2  | * | 7/2007  | Brown .................. C23C 14/046 |
|           |     |   |         | 204/298.06                         |
| 8,018,164 | B2  | * | 9/2011  | Shannon ........... H01J 37/32082  |
|           |     |   |         | 156/345.2                          |

(Continued)

FOREIGN PATENT DOCUMENTS

| CN | 1129229   C  | 11/2003 |
|----|--------------|---------|
| CN | 101971714 A  | 2/2011  |

(Continued)

OTHER PUBLICATIONS

International Search Report for corresponding PCT Application No. PCT/EP2012/100223, mailed Feb. 6, 2013, 4 pages.

*Primary Examiner* — Douglas W Owens
*Assistant Examiner* — Srinivas Sathiraju
(74) *Attorney, Agent, or Firm* — Fish & Richardson P.C.

(57) ABSTRACT

In one aspect, a method includes protecting passive components connected to a high-frequency generator. In another aspect, a system includes a high-frequency generator having an HF source generating a high-frequency power signal at a fundamental frequency, and having a first control circuit which is fed with a signal related to an HF power transmitted by a high-frequency cable between the high-frequency generator and a load.

23 Claims, 3 Drawing Sheets

(56) References Cited

U.S. PATENT DOCUMENTS

| | | | | |
|---|---|---|---|---|
| 8,018,243 B2* | 9/2011 | Mann | ................ | H01J 37/32082 324/605 |
| 8,324,525 B2* | 12/2012 | Shannon | ........... | H01J 37/32091 118/723 R |
| 8,337,661 B2* | 12/2012 | Shannon | ........... | H01J 37/32091 118/723 R |
| 8,357,264 B2* | 1/2013 | Shannon | ........... | H01J 37/32091 118/723 R |
| 8,542,076 B2* | 9/2013 | Maier | ............ | H01J 37/32082 333/32 |
| 8,731,496 B2* | 5/2014 | Drogi | ........................ | H03F 3/24 455/107 |
| 8,884,523 B2* | 11/2014 | Winterhalter | ............ | H05H 1/46 315/111.21 |
| 9,099,284 B2* | 8/2015 | Yang | ................ | H01J 37/32082 |
| 9,171,700 B2* | 10/2015 | Gilmore | ............ | H01J 37/32183 |
| 9,337,000 B2* | 5/2016 | Marakhtanov | .... | H01J 37/32183 |
| 9,401,264 B2* | 7/2016 | Marakhtanov | .... | H01J 37/32183 |
| 2005/0127843 A1* | 6/2005 | Koulik | ................... | B65B 55/10 315/111.01 |
| 2008/0012548 A1 | 1/2008 | Gerhardt et al. | | |
| 2008/0105538 A1* | 5/2008 | Winterhalter | ............ | H05H 1/46 204/192.1 |
| 2008/0150361 A1* | 6/2008 | Helde | ................ | H01J 37/32045 307/31 |
| 2009/0140722 A1* | 6/2009 | Mann | ................ | H01J 37/32082 324/120 |
| 2009/0295295 A1* | 12/2009 | Shannon | ........... | H01J 37/32082 315/111.21 |
| 2011/0006687 A1* | 1/2011 | Gesche | ............. | H01J 37/32082 315/111.21 |
| 2011/0148519 A1* | 6/2011 | Drogi | ........................ | H03F 3/24 330/129 |
| 2013/0119017 A1* | 5/2013 | Yang | ................ | H01J 37/32082 216/61 |
| 2014/0159580 A1* | 6/2014 | Fritsch | ............. | H01J 37/32174 315/111.21 |
| 2014/0159741 A1* | 6/2014 | Bannwarth | ............ | G01R 31/24 324/537 |

FOREIGN PATENT DOCUMENTS

| | | |
|---|---|---|
| DE | 960018 | 2/1957 |
| DE | 140097 | 2/1980 |
| DE | 102009046754 A1 | 5/2011 |

* cited by examiner

PROTECTING PASSIVE HF GENERATOR COMPONENTS

TECHNICAL FIELD

The invention relates to a method for protecting passive components connected to a high-frequency generator. The invention also relates to a high-frequency generator having an HF source generating a high-frequency power signal at a fundamental frequency, and having a first control circuit which is fed with a signal related to an HF power transmitted by a high-frequency cable between the high-frequency generator and a load.

BACKGROUND

High-frequency cables, in particular coaxial cables, are used to transmit a high-frequency power generated at a fundamental frequency (also known as working frequency) from a high-frequency generator to a matching network (matchbox). The high-frequency power is transmitted from the matching network to a load, for example to a plasma chamber. If the matching network is unable to match the output resistance of the high-frequency generator with the load resistance, then some of the power is reflected on the load due to the mismatch. In this case, power is produced at harmonic frequencies of the fundamental frequency. Power at these frequencies passes through the matching network and the high-frequency cable and arrives at the high-frequency generator.

In the case of harmonic frequencies, the load (the plasma), an electrode, the matching network, the high-frequency cable and an output circuit of the high-frequency generator act as reactance elements with a high intrinsic quality. The excitation by the harmonics, caused by the reflection on the load (for example 100 W effective power of the harmonics with 10 kW power at the working frequency) can thus cause resonances with a high reactive power (for example 10 kVA). This reactive power represents an additional load on the high-frequency cable between high-frequency generator and matching network. This problem applies in particular to so-called dual frequency systems, since these systems have a particularly large number of reactance elements (two high-frequency generators, HF cables and impedance-matching networks with filters). The loading of the high-frequency cable with reactive power can result in failure of the high-frequency cable.

SUMMARY

The object of the present invention is therefore to provide a method and a high-frequency generator, by which it is possible to avoid the above-mentioned problems.

This object is achieved by a method for protecting passive components, in particular a high-frequency cable, connected to a high-frequency generator, the method comprising the following steps:
 a. generating a high-frequency power at a fundamental frequency by means of the high-frequency generator;
 b. transmitting the high-frequency power to a load via a high-frequency cable;
 c. determining a variable related to the high-frequency load, in particular at least at one frequency differing from the fundamental frequency, on at least one passive component, in particular on a high-frequency cable, connected to the high-frequency generator;
 d. comparing the determined variable with a reference variable which describes the maximum load (maximum permissible load) on at least one connected passive component;
 e. adjusting the high-frequency power generated by the high-frequency generator at the fundamental frequency on the basis of the comparison result.

By detecting the transmitted high-frequency power or a variable, which is related to the high-frequency load of a passive component, in particular of the high-frequency cable (HF cable), the generator power can be reduced to prevent an overload of the passive component(s), in particular of the high-frequency cable. It is thereby possible to control (open-loop or closed-loop loop control) the power generated by the high-frequency generator at the fundamental frequency based on the high-frequency load on the passive component, in particular on the HF cable which has been detected. It is possible to determine the transmitted high-frequency power or a variable related thereto at the fundamental frequency and/or at one or a plurality of frequencies differing therefrom. Passive components can be, for example, high-frequency cables, connection elements (plugs), measuring devices, electrodes, plasma chambers, etc. The method is preferably used when HF power is generated at fundamental frequencies within a range of 1 to 100 MHz and at wattages within a range of 1 kW to 100 kW and in plasma generation and laser excitation systems.

The high-frequency power generated by the high-frequency generator at the fundamental frequency can be controlled by an open-loop control or in particular by a closed-loop control on the basis of the comparison result. Thus, not only open-loop control, but also closed-loop control is possible. In particular, a limiting control can be performed.

Furthermore, a variable related to the high-frequency power transmitted by the high-frequency cable at the fundamental frequency can be determined, the determined variable can be compared with a set value of the high-frequency power, and the high-frequency power generated by the high-frequency generator at the fundamental frequency can be adjusted on the basis of the comparison result. Accordingly, the high-frequency power, generated by the high-frequency generator at the fundamental frequency can be adjusted according to two criteria. Firstly, care can be taken that the high-frequency load on the passive component(s), in particular on the high-frequency cable, does not become excessive. Secondly, the power which is provided for a load can be detected and the generated power can be adjusted accordingly to obtain as effectively as possible a set value for the power supplied to the load at the fundamental frequency. In particular, it is possible to regulate the power according to a nominal power. In this respect, for adjusting the high-frequency power generated by the high-frequency generator at the fundamental frequency, it is possible to use the comparison result which leads to a relatively greater reduction in the high-frequency power. Thereby, on the one hand an overload of the passive component(s), in particular of the high-frequency cable, is effectively counteracted and on the other, an excessive amount of power is prevented from being supplied to the load.

The power transmitted by the high-frequency cable at frequencies different from the fundamental frequency can be determined. When the power transmitted at frequencies different from the fundamental frequency or when a variable related thereto is determined, it is then particularly easy to determine the high-frequency load on the high-frequency cable or on the passive component(s). In particular, the load can be determined by harmonics.

It can also be provided that the entire power transmitted in one direction by the high-frequency cable is determined. In this respect, either the entire power, the power transmitted in the forward direction, i.e. from the high-frequency generator to the load, or the power reflected on the load can be determined. It is also possible to determine which power is transmitted for each direction.

Furthermore, the power transmitted in one direction by the high-frequency cable at the fundamental frequency can be determined. When the power transmitted in one direction at the fundamental frequency is determined and when the entire power transmitted in one direction is determined, it is possible, by forming the difference, to evaluate which high-frequency load is caused by frequencies differing from the fundamental frequency, for example by harmonics or frequencies below the fundamental frequency.

To monitor a high-frequency generator, it can be advantageous to display the entire power and/or the power at the frequencies different from the fundamental frequency transmitted in the direction of the load by the high-frequency cable. The displayed power or the displayed load on the high-frequency cable can use the fundamental frequency as a reference frequency.

A variant of the method can provide that a signal which is related to the power transmitted by the high-frequency cable is filtered using a broadband band-pass filter. As a result, it is possible in particular to determine the power in the case of harmonics. Filtering can be carried out within a range of 1 to 200 MHz.

In this respect, the band-pass filter can be modified with a correction frequency response. Subject to frequency, high-frequency cables have a differing power rating. If harmonics occur at different frequencies, higher frequencies for example can be evaluated more thoroughly by a correction frequency response to thus provide more accurate information about the load on the high-frequency cable. In particular it can thereby be considered that, in the case of mismatching, the cable rating is lower than the power rating specified in the data sheet for the high-frequency cable.

Furthermore, it can be provided that the high-frequency load on the high-frequency cable or on the passive component(s) is determined using the forward power supplied in the direction of the load by the high-frequency generator or using the reflected power. For example, if a high-frequency generator has a high reflection factor for all frequencies and if the load has a high reflection factor for all frequencies apart from the fundamental frequency, then it is possible for only the reflected power to be considered. This is because for each harmonic frequency, the forward power is the same as the reflected power.

However, if the high-frequency generator has a low reflection factor for all frequencies or for all frequencies apart from the fundamental frequency, and if the load has a high reflection factor for all frequencies apart from the fundamental frequency, all harmonics coming from the load are absorbed in the generator. The forward power and the reflected power have to be evaluated for measuring the harmonic power and for the cable load.

A variant of the method can provide that the high-frequency load on a plurality of high-frequency cables or passive components, by which a respective high-frequency generator is connected to the load, is determined and if the high-frequency load exceeds a predetermined value, the high-frequency power of all HF generators connected to the load, which is generated at the respective fundamental frequency, is reduced.

The reference variable describing the maximum load (maximum permissible load) of a passive component can be adjusted. As a result, it is possible to adjust to the passive component which is used in each case.

Furthermore, the reference variable describing the maximum load can be determined from a catalogue of predetermined characteristics of at least one passive component and/or of at least one active component connected to the plasma chamber. For example, a manufacturer can specify for a passive component one or more parameters, from which the reference variable is then determined, thus for example is selected or calculated. Active components connected to the plasma chamber can be, for example, matching networks (matchboxes) or high-frequency generators.

As an alternative or in addition, the reference variable describing the maximum load can be adjusted automatically. The reference variable can be automatically adjusted, for example, on the basis of the automatic detection of connected passive components, such as high-frequency cables, or of other high-frequency generators which can operate at other frequencies.

The scope of the invention also includes a high-frequency generator having an HF source generating a high-frequency power signal at a fundamental frequency, and having a first control circuit, which is fed with a signal related to an HF power transmitted by a high-frequency cable between the high-frequency generator and a load, the control circuit having a controller for controlling the HF source based on a set value (supplied to the controller) for the HF load, in particular for the HF cable load, in particular based on a maximum value as reference value, and the transmitted HF power. Accordingly, with a high-frequency generator of this type, the output power of the high-frequency generator can be controlled at the fundamental frequency on the basis of the (cable) load. It is thereby possible to not only regulate the output power at a set value for the output power.

The control circuit can have a broadband band-pass filter. A band-pass filter of this type makes it possible to determine the power which is transmitted at the harmonics. In particular, the filter can be adjusted to a frequency band within a range of 1 to 200 MHz.

The band-pass filter can have a correction frequency response. Consequently, it can be considered that the cable power rating is based on a 50Ω load case, while a reflection factor of 1 is present for harmonics.

Furthermore, a second control circuit can be provided, which is fed with a signal related to an HF power transmitted by a high-frequency cable between the high-frequency generator and a load. The control circuit has a controller for controlling the HF source based on a set value, supplied to the controller, for the high-frequency power to be output by the high-frequency generator at the fundamental frequency, and the transmitted HF power. It is thereby also possible to regulate to a set value for the high-frequency power.

The second control circuit can have a filter which is adjusted to the fundamental frequency. Consequently, it is possible to detect the power which is supplied to the load at the fundamental frequency or the power which is reflected to the fundamental frequency.

The controllers can be connected to the HF source by a priority circuit. In this respect, the priority circuit can be configured as a limiting controller. Alternatively, it is possible to configure the priority circuit as a digital controller. In particular, it is thereby possible for the control circuit, which produces a greater reduction in the HF power generated by the HF source at the fundamental frequency, to be prioritised for controlling the high-frequency source.

Furthermore, means can be provided for determining the harmonic power transmitted by the HF cable. It is thereby possible to determine the proportion of the (cable) load, which is made up by the harmonic power.

In addition, means can be provided for determining the high-frequency power transmitted by the HF cable. In particular, it is thereby possible to determine the entire power transmitted by the HF cable.

One or more display devices can be provided to display the harmonic power transmitted by the HF cable and/or to display the high-frequency power transmitted by the HF cable. Consequently, an operator can immediately receive information about the high-frequency load on the HF cable or on a further passive component or components.

The scope of the invention also includes a power supply arrangement comprising a high-frequency generator according to the invention, which is connected to a load by a high-frequency cable. Furthermore, at least one further high-frequency generator can be connected to the load by a high-frequency cable. This produces a so-called dual frequency system, this system being protected by the high-frequency generator according to the invention against the failure of high-frequency cables.

A directional coupler can be provided to determine the forward power or the reflected power. In this respect, it can be provided that the directional coupler has a fixed coupling factor. The directional coupler is preferably arranged at the high-frequency output of the high-frequency generator. The directional coupler can be provided externally or can be part of the high-frequency generator. As an alternative to using a directional coupler, it is possible to measure the current or voltage in order to determine the cable load.

The power supply arrangement can comprise a first and a second high-frequency generator.

In the power supply arrangement, the first high-frequency generator can generate a high-frequency power signal at a first fundamental frequency of in particular 3.39 MHz, and the second high-frequency generator can generate a high-frequency power signal at a second frequency of in particular 13.56 MHz.

The two high-frequency generators can each be connected by high-frequency cables to impedance matching elements which, in turn, are jointly connected to an electrode of a plasma chamber.

The high-frequency generators can each comprise a first control circuit, as described above.

The load can be configured as a plasma installation.

Further features and advantages of the invention are provided in the following detailed description of embodiments of the invention, with reference to the figures of the drawings which show details essential to the invention, and are also provided in the claims. The features shown there are presented such that the features according to the invention can be made clearly visible. The various features can be realised individually per se or in a plurality of combinations in variants of the invention.

Embodiments of the invention are illustrated in the schematic drawings and are described in more detail in the following description.

DETAILED DESCRIPTION

Figure 1:
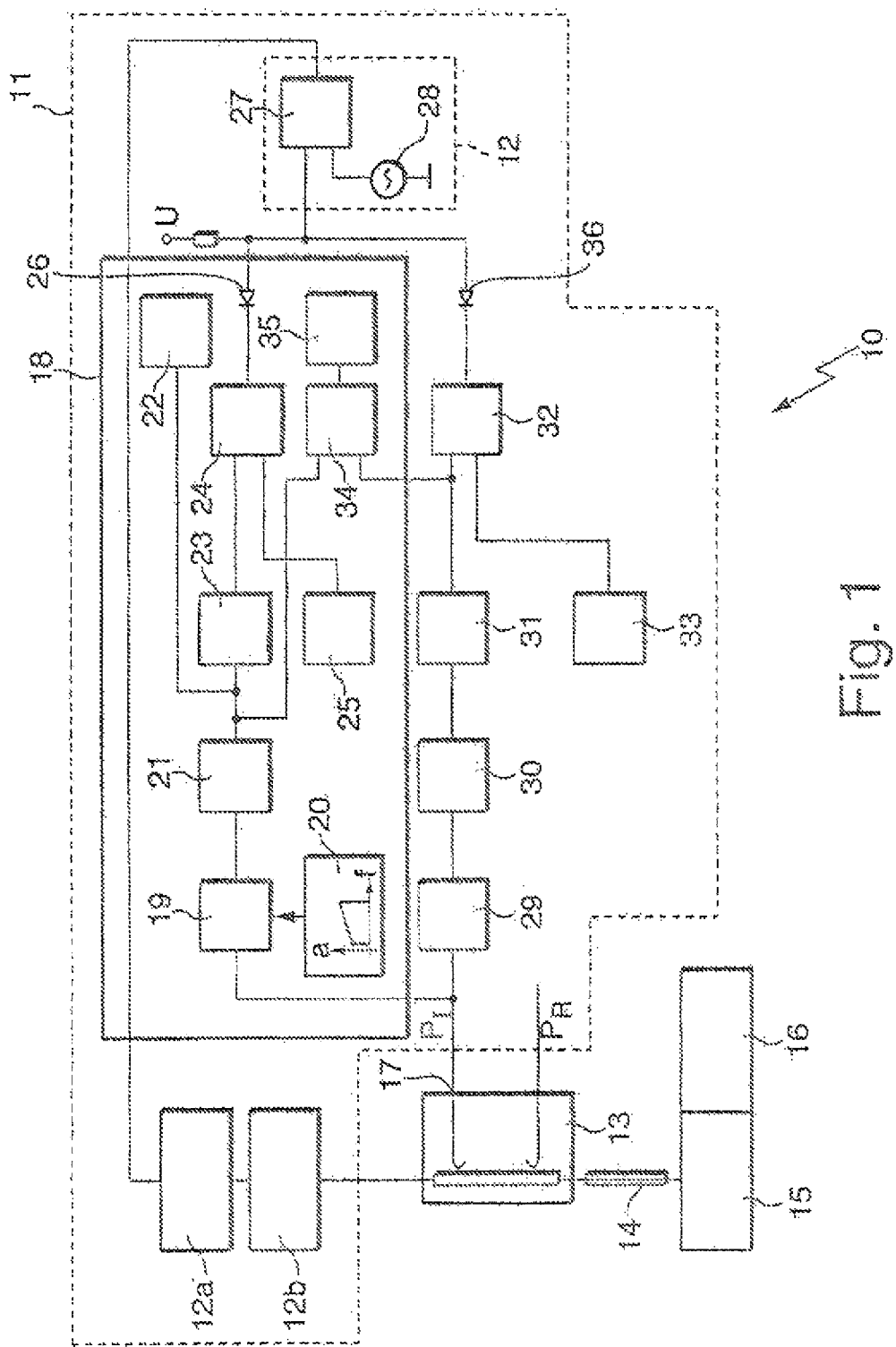
FIG. 1 shows a first embodiment of a power supply arrangement.

FIG. 1 shows a power supply arrangement 10. The power supply arrangement 10 comprises a high-frequency generator 11 which comprises a high-frequency source 12, an HF driver stage 12a and an HF output stage 12b as the output circuit. A measuring device 13, configured as a directional coupler is connected to the output of the high-frequency generator 11. From there, a high-frequency cable 14 extends to an impedance matching network 15 which, in turn, is connected to a load 16 configured as a plasma installation.

In the configuration of the power supply arrangement 10 according to FIG. 1, it is assumed that the high-frequency generator 11 has a high reflection factor for all frequencies. It is also assumed that the load 16 has a high reflection factor for all frequencies apart from the fundamental frequency. In this case, the forward power $P_1$ is the same as the reflected power $P_R$ for every harmonic amplitude. This means that only the forward power, which is designated here by $P_1$, has to be considered for the measurement of the harmonic power and of the cable load. The term "forward power" is understood as meaning the power which is conducted in the direction of the load 16 from the high-frequency generator 11.

Thus, received at the output 17 of the measuring device 13 is a signal, for example within a range of between 0 and 1 W, which has both the fundamental frequency at which an HF power signal is generated by the high-frequency generator 11, as well as other frequencies, for example harmonics. This signal is fed to a control circuit 18 and is there fed in particular to a broadband band-pass filter 19. The band-pass filter 19 can filter frequencies within a range of 1 to 200 MHz. The band-pass filter 19 is influenced by a correction frequency response 20 of the cable power rating.

The filtered signal is fed to a detector 21 which generates from the filtered signal a direct voltage signal which shows a measurement of the actual value of the entire high-frequency power which is transmitted to the load 16 by the HF cable 14. It is thereby possible for an actual value of the HF power to be displayed on the display device 22.

The output signal from the detector 21 is inverted in the inverter 23 and the inverted signal is fed to a summing controller 24. The set value of the HF cable power 25 is also fed to the controller 24 as a reference variable. Since the inverter 23 inverts the measurement of the actual power, the actual power is effectively subtracted in the controller 24 from the set value of the HF cable power 25, and it is then determined whether the actual power exceeds the set value.

The controller 24 is connected to a mixer 27 of the HF source 12 via a limiting controller 26. A high-frequency oscillator 28 is also connected to the mixer 27. If the controller 24 establishes that the actual value of the HF cable power exceeds the set value of the HF cable power, the mixer 27 is actuated such that the high-frequency power output by the high-frequency generator 11 at the fundamental frequency is reduced.

Furthermore, the signal at the output 17 is fed to a band-pass filter 29 which is adjusted to the fundamental frequency, i.e. it is a narrow-band filter. The filtered signal, which is still only related to the power at the fundamental frequency without harmonics, is fed to a detector 30 which gives therefrom a direct-voltage signal which is a measurement of the actual value of the high-frequency power at the fundamental frequency without harmonics. This signal is inverted by the inverter 31 and is fed to a controller 32 configured as a summing controller. The set value of the high frequency power 33 at the fundamental frequency is also fed to the controller 32.

The output signal from the controller 32 is fed to the mixer 27 via the limiting controller 36. The limiting controllers 26, 36 cause the output value of that controller 24, 32, which produces a greater reduction in the high-frequency power generated at the fundamental frequency, to influence the output power of the high-frequency generator 11. For correct operation, a voltage signal is also provided which is connected via a power supply U and a current-limiting resistor. The controllers 24, 32 essentially make a comparison. Comparison elements could also be used instead of the controllers 24, 32. In this case, the output signals from the detectors 21, 30 would not have to be inverted. Inverting is carried out so that a difference from a set value or reference value can be determined in the controllers 24, 32.

In the summing element 34, the inverted output signal from the detector 30 is added to the output signal from the detector 21. This means that the measurement of the power at the fundamental frequency is subtracted from the measurement of the total power. The result is the actual value of the power or a variable related thereto at frequencies which differ from the fundamental frequency, in particular from the harmonic power, which power is then displayed on the display device 35.

Figure 2:
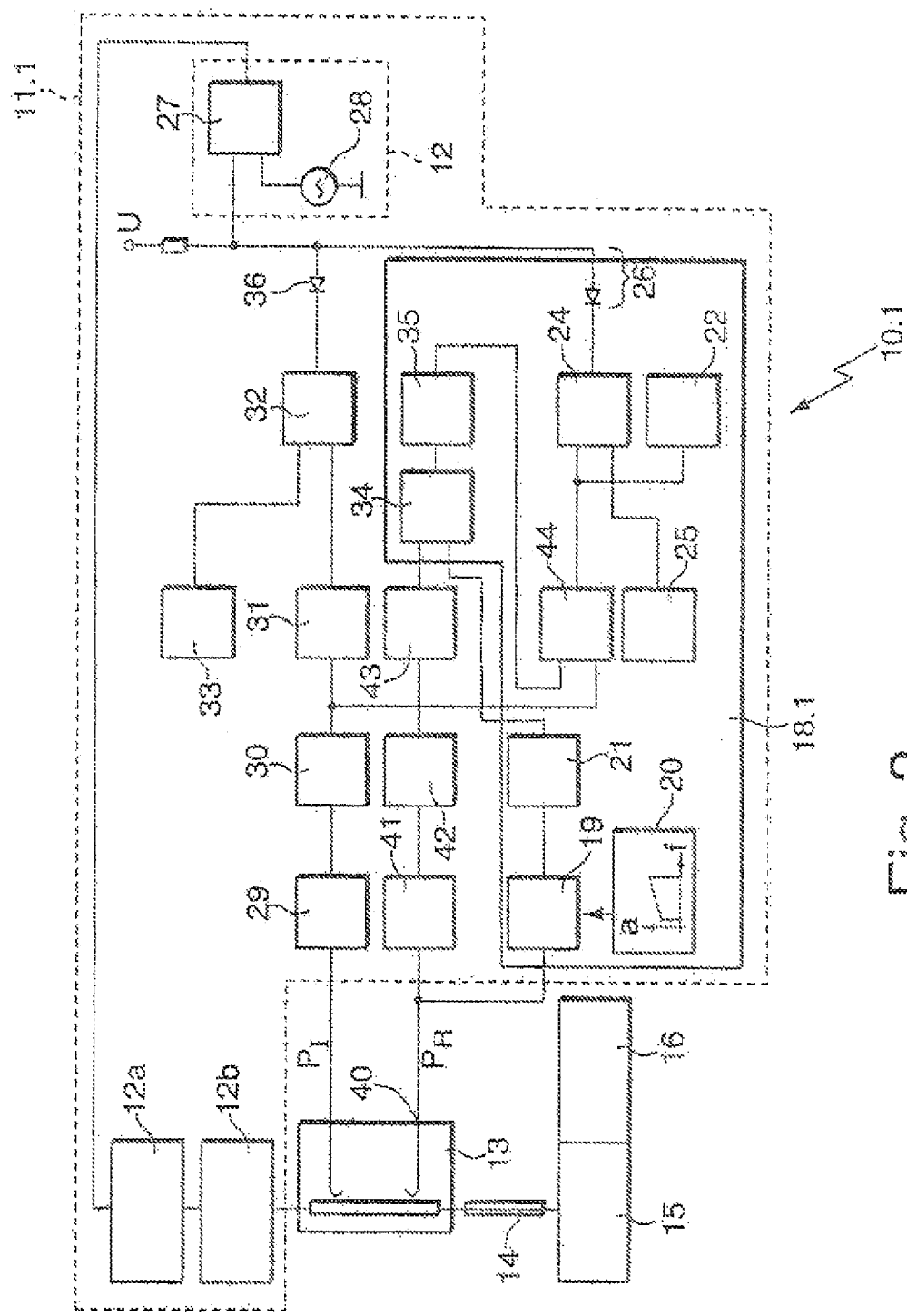
FIG. 2 shows a second embodiment of a power supply arrangement.

FIG. 2 shows an embodiment of a power supply arrangement 10.1, in which the high-frequency generator 11.1 has a lower reflection factor for all frequencies or for all frequencies apart from the fundamental frequency. The load has a high reflection factor for all frequencies apart from the fundamental frequency. In this case, it is necessary to evaluate the forward power $P_1$ and the reflected power $P_R$ at the HF output of the high-frequency generator 11.1 in order to measure the harmonic power and the cable load. Elements which correspond to those of FIG. 1 have been provided with the same reference numerals in FIG. 2.

It can be seen that the control circuit 18.1 is now connected to the output 40 of the measuring device 13. Also connected to the output 40 is a narrow-band band-pass filter 41 which has been adjusted to the fundamental frequency. Here, a variable is determined which is related to the reflected power at the fundamental frequency. The output signal from the band-pass filter 41 is fed to a detector 42, the output signal of which is a direct-voltage signal which is inverted in the inverter 43. Unlike the situation in FIG. 1, the output signal from the inverter 43 and not the output signal from the inverter 31 is fed to the summing element 34. Here again, the output signal from the summing element 34 is a measurement of the actual value of the harmonic power which is displayed on the display device 35.

The control circuit 18.1 no longer has an inverter 23. For this purpose, a further summing element 44 is provided which is fed with the actual value of the reflected harmonic power (or with a variable related thereto) and with the actual value of the forward power at the fundamental frequency, i.e. with the output signal from the detector 30. The result which is released at the output of the summing element 44 corresponds to the actual value of the high-frequency cable power. Furthermore, this signal is fed to the controller 24.

Figure 3:
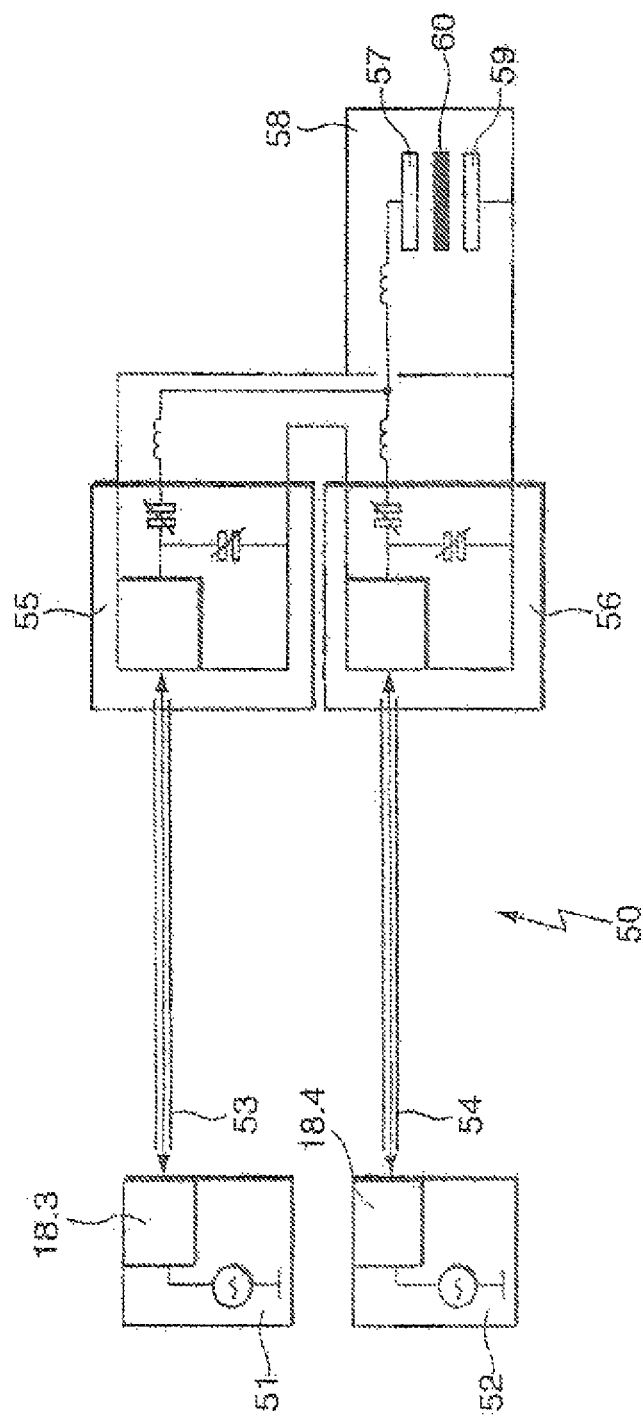
FIG. 3 is a schematic illustration of a dual frequency system.

FIG. 3 shows a power supply arrangement in the form of a so-called dual frequency system 50. This system 50 comprises a first high-frequency generator 51 and a second high-frequency generator 52. The high-frequency generator 51 generates, for example, a high-frequency power signal at a fundamental frequency of 3.39 MHz, whereas the high-frequency generator 52 generates, for example, a high-frequency power signal at a frequency of 13.56 MHz. Each high-frequency generator 51, 52 is connected by high-frequency cables 53, 54 to impedance matching elements 55, 56 which, in turn, are jointly connected to the electrode 57 of a plasma chamber 58. Located in the plasma chamber 58 is a counter electrode 59 which is connected to earth. Plasma 60 is generated between electrode 57 and counter electrode 59.

The high-frequency generators 51, 52 each have a control circuit 18.3, 18.4 of the type described in FIG. 1 or in FIG. 2.

The invention claimed is:

1. A method of protecting one or more passive components connected to a high-frequency generator, the method comprising:
    generating a high-frequency power at a fundamental frequency using the high-frequency generator;
    transmitting the high-frequency power in a first direction to a load by a high-frequency cable;
    determining a variable related to a high-frequency load on at least a first passive component connected to the high-frequency generator by using at least one of the high-frequency power in the first direction or a reflected power in a second direction from the load, the reflected power being generated by the high-frequency power reflected by the load and comprising power at least at one frequency different from the fundamental frequency;
    comparing the determined variable with a reference variable which describes a maximum load on the at least first passive component; and
    adjusting the high-frequency power, generated by the high-frequency generator at the fundamental frequency, based on the comparison result.

2. The method of claim 1, wherein the high-frequency power generated by the high-frequency generator at the fundamental frequency is controlled based on a result of comparing the determined variable with the reference variable.

3. The method of claim 1, comprising:
    determining a second variable related to the high-frequency power, transmitted by the high-frequency cable at the fundamental frequency;
    comparing the determined second variable with a set value of the high-frequency power; and
    matching the high-frequency power generated by the high-frequency generator at the fundamental frequency on the basis of the result of comparing the determined second variable with the set value of the high-frequency power.

4. The method of claim 3, wherein adjusting the high-frequency power generated by the high-frequency generator at the fundamental frequency comprises using the comparison result to produce a relatively greater reduction in the high-frequency power.

5. The method of claim 1, comprising determining the power transmitted by the high-frequency cable at frequencies different from the fundamental frequency.

6. The method of claim 1, comprising displaying at least one of the entire power or the power at the frequencies which differ from the fundamental frequency transmitted in the second direction from the load by the high-frequency cable.

7. The method of claim 1, comprising determining the high-frequency loads on a plurality of passive components, and if one of the determined high-frequency loads exceeds a predetermined value, reducing the high-frequency power generated at the respective fundamental frequency of all high-frequency generators connected to the load.

8. The method of claim 1, comprising adjusting the reference variable describing the maximum load on a passive component.

9. The method of claim 1, wherein the at least first passive component comprises at least one of the high-frequency cable, a plug, a measuring device, an electrode, or a plasma chamber.

10. A high-frequency generator comprising:
   a high-frequency (HF) source configured to generate a high-frequency power signal at a fundamental frequency; and
   a first control circuit which is fed with a signal related to an HF power transmitted by a high-frequency cable between the HF source and a load;
   wherein the first control circuit has a first controller for controlling the HF source based on a first set value fed to the first control circuit and the transmitted HF power, the first set value describing a maximum load on at least a first passive component connected to the HF source, and
   wherein the first controller is configured to:
      compare the first set value with a first value related to an HF load on the at least first passive component, the first value being determined by using at least one of the HF power in a first direction to the load or a reflected power in a second direction from the load, the reflected power being generated by the HF power reflected by the load and comprising power at least at one frequency different from the fundamental frequency, and
      adjust, based on the comparison result, the HF power signal generated by the HF source at the fundamental frequency.

11. The high-frequency generator of claim 10, comprising a second control circuit which is fed with a second signal related to the HF power transmitted by the high-frequency cable between the high-frequency generator and the load, wherein the second control circuit has a second controller for controlling the HF source based on a second set value for the high-frequency power to be output by the high-frequency generator at the fundamental frequency and the transmitted HF power.

12. The high-frequency generator of claim 11, wherein the first and second controllers are connected to the HF source by a priority circuit.

13. The high-frequency generator of claim 11, wherein the second control circuit comprises a filter which is tuned to the fundamental frequency.

14. The high-frequency generator of claim 10, comprising a device configured to determine a harmonic power transmitted by the HF cable, the harmonic power being at least at one harmonic frequency of the fundamental frequency.

15. The high-frequency generator of claim 10, comprising a device configured to determine the high-frequency power transmitted by the HF cable.

16. The high-frequency generator of claim 10, wherein the first control circuit comprises a broadband band-pass filter.

17. The high-frequency generator of claim 16, wherein the band-pass filter is configured to have a correction frequency response.

18. The high-frequency generator of claim 10, wherein the at least first passive component comprises at least one of the high-frequency cable, a plug, a measuring device, an electrode, or a plasma chamber.

19. A system comprising:
   a high-frequency generator comprising:
      a high-frequency (HF) source configured to generate a high-frequency power signal at a fundamental frequency; and
      a first control circuit which is fed with a signal related to an HF power transmitted between the high-frequency source and a load;
      wherein the first control circuit has a first controller for controlling the HF source based on a set value fed to the first control circuit and the transmitted HF power, the set value describing a maximum load on at least a first passive component connected to the HF source; and
   a high-frequency cable connected to the load and the high-frequency generator,
   wherein the first controller is configured to:
      compare the set value with a value related to an HF load on the at least first passive component, the value being determined by using at least one of the HF power in a first direction to the load or a reflected power in a second direction from the load, the reflected power being generated by the HF power reflected by the load and comprising power at least at one frequency different from the fundamental frequency, and
      adjust, based on the comparison result, the HF power signal generated by the HF source at the fundamental frequency.

20. The system of claim 19, wherein the at least first passive component comprises at least one of the high-frequency cable, a plug, a measuring device, an electrode, or a plasma chamber.

21. The system of claim 19, comprising a second high-frequency generator connected to the load by a second high-frequency cable.

22. The system of claim 21, wherein the first and second high-frequency generators are each connect by high-frequency cables to respective impedance-matching elements which, in turn, are jointly connected to an electrode of a plasma chamber.

23. The system of claim 19, comprising one or more display devices configured to display a harmonic power transmitted by the HF cable, the harmonic power being at least at one harmonic frequency of the fundamental frequency.

* * * * *